United States Patent [19]

Maly et al.

[11] Patent Number: 4,835,466
[45] Date of Patent: May 30, 1989

[54] APPARATUS AND METHOD FOR DETECTING SPOT DEFECTS IN INTEGRATED CIRCUITS

[75] Inventors: Wojciech Maly, Pittsburgh, Pa.; Michael E. Thomas, Cupertino, Calif.

[73] Assignee: Fairchild Semiconductor Corporation, Cupertino, Calif.

[21] Appl. No.: 11,729

[22] Filed: Feb. 6, 1987

[51] Int. Cl.[4] .................. G01R 31/02; G01R 27/02
[52] U.S. Cl. ............................... 324/158 R; 324/62; 437/8
[58] Field of Search ............ 324/62, 64, 65 R, 158 R, 324/158 D, 158 T; 437/8

[56] References Cited

U.S. PATENT DOCUMENTS

| | | | |
|---|---|---|---|
| 4,144,493 | 3/1979 | Lee et al. | 437/8 |
| 4,386,459 | 6/1983 | Boulin | 324/158 R |
| 4,516,071 | 5/1985 | Buehler | 324/158 R |
| 4,542,340 | 9/1985 | Chakravarti et al. | 324/158 T |

FOREIGN PATENT DOCUMENTS

| | | | |
|---|---|---|---|
| 0036951 | 2/1986 | Japan | 437/8 |
| 0186846 | 8/1986 | Japan | 324/65 R |

OTHER PUBLICATIONS

Brochure entitled "LithoMap TM LM20 Lithography Characterization System", Prometrix, 3255 Scott Blvd., Santa Clara, CA 95054.
Brochure entitled "LithoMap TM LM20 Defect Monitor Option", Prometrix Corporation, 3255 Scott Blvd., Santa Clara, CA 95054.
Brochure entitled "Prometrix Announces the Defect Monitor".
Paper entitled "A Multilevel Interconnect Test Vehicle for Wafer Scale Integration", S. Westbrook et al., V—MIC Conf., Jun. 25–26, 1985.
Article entitled "Novel IC Metallization Test Structures for Drop-In Monitors", R. Spencer, Solid State Technology, Sep. 1983.
Article entitled "VLSI Multilevel Metal Defect Characterization System", M. Heath et al., Proceedings IEEE Southeastcon, Apr. 5–8, 1987.
Brochure entitled "Prometrix Introduces Defect Monitor II", Prometrix Corporation, 3255 Scott Blvd., Santa Clara, CA 95054.
Paper entitled "A Comprehensive Test Chip for the Characterization of Multi-Level Interconnect Processes", D. J. Radack et al., V–MIC Conf., Jun. 15–16, 1987.

(List continued on next page.)

Primary Examiner—Reinhard J. Eisenzopf
Assistant Examiner—W. Burns
Attorney, Agent, or Firm—Lee Patch; William H. Murray

[57] ABSTRACT

Spot defects are detected utilizing an apparatus which comprises a meander structure formed in a high resistivity material on a substrate. The meandor includes intermediate segments, the ends of which are interconnected by folded segments such that an electrical circuit having electrical resistance R is formed between the ends of the meander. A strip of high electrical conductivity material is formed in substantial alignment with and is electrically insulated from a corresponding one of each of the intermediate segments. Each end of each strip is electrically connected to a corresponding end of a corresponding intermediate segment. Defects are identified by measuring the resistance R, between the ends of the meander. This measured value is then compared to the calculated value of R. If the value of the measured resistance is substantially smaller than the calculated value, a flaw due to a spot of additional high conductivity material, is considered to be present. If the measured resistance is substantially greater than the calculated resistance, a flaw due to a spot of missing high conductivity material is determined to exist. The size of the defects, either additional or missing material, can be determined by additionally measuring the resistance of a path comprising two intermediate segments and a foled segment connected therebetween, then calculating the defect size using predetermined formulae.

12 Claims, 10 Drawing Sheets

OTHER PUBLICATIONS

Paper entitled "Proposed Comprehensive Test Vehicle for Monitoring Multilevel Interconnection Process Variabilities, Misalignment, Parametrics and Defect Density", T. E. Wade, V-MIC Conf., 6/9-10/1986.

"Technique for Determining the Untrimmed Value of an Isolated Resistor in an Integrated Circuit", C. K. Bartley et al., IBM Technical Disclosure Bulletin, vol. 27, No. 1A, Jun., 1984, pp. 2-3.

"Back-Contact Resistor Network Pares Wire Count In FCL Hybrids", Walter et al., Electronics International, vol. 55, No. 10, May 1982, pp. 173-174.

"Resistor Grids in Hybrid Circuits", V. Bapesware Rao et al., Microelectronics Journal, vol. 11, No. 4, Aug. 1980.

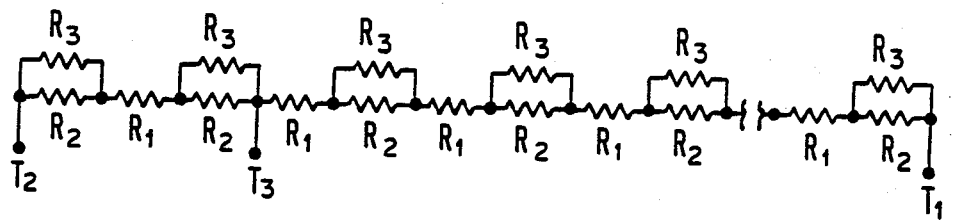
_Fig. 3A_
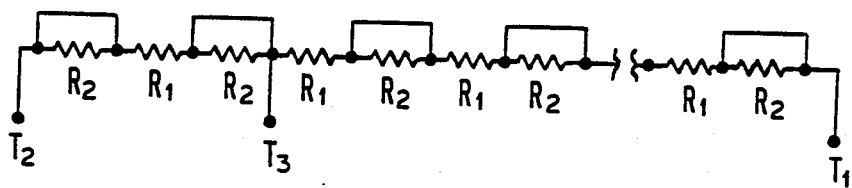
_Fig. 3B_
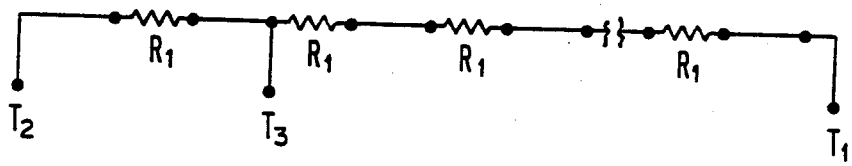
_Fig. 3C_

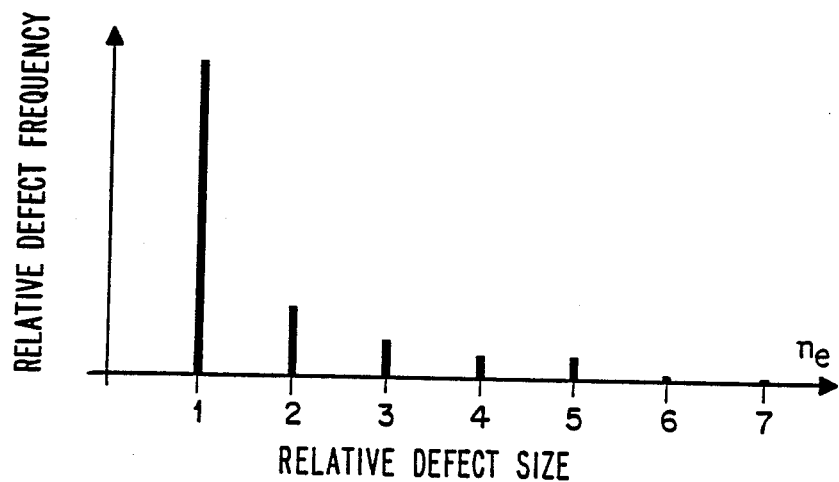
_Fig. 11A_
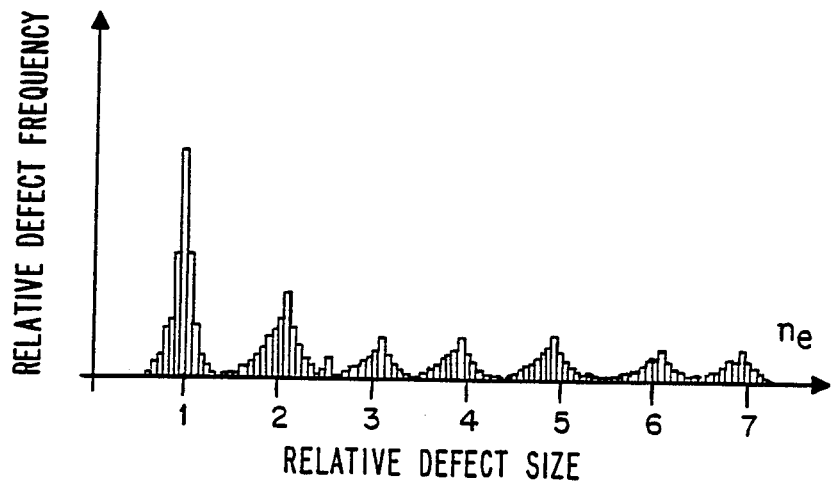
_Fig. 11B_

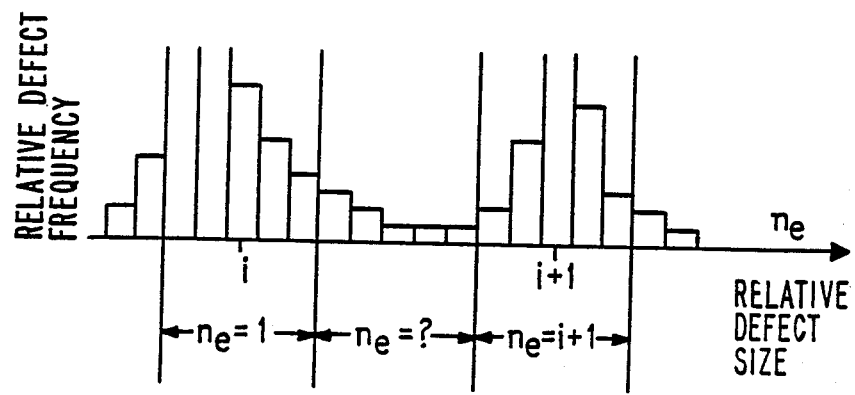
Fig. IIC
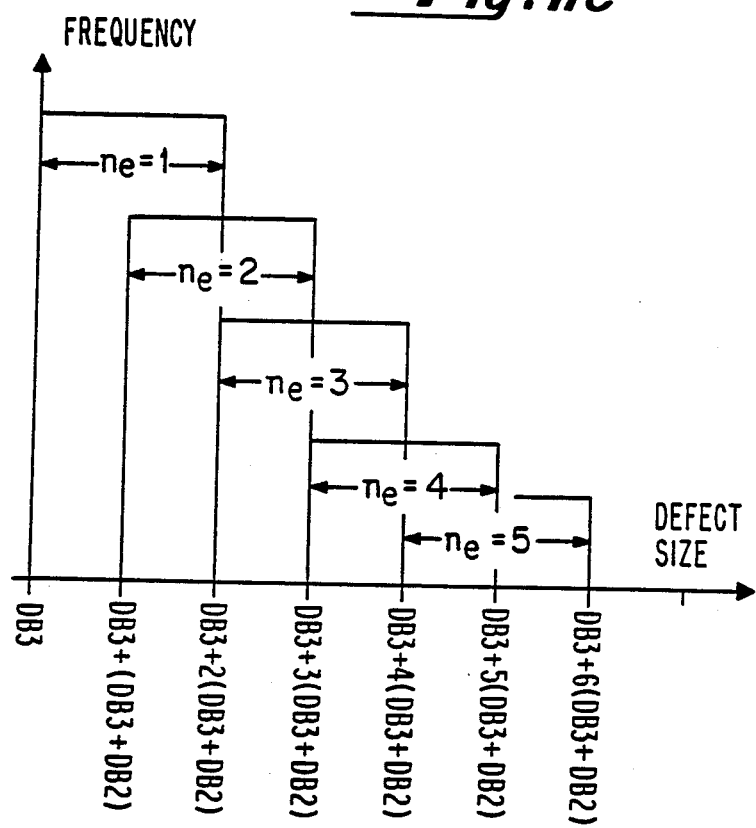
Fig. IID

APPARATUS AND METHOD FOR DETECTING SPOT DEFECTS IN INTEGRATED CIRCUITS

BACKGROUND OF THE INVENTION

The present invention pertains to apparatus for use in manufacturing integrated circuits and more particularly to apparatus and methods for detecting spot defects in such circuits.

Yield prediction and yield estimation are very important considerations in integrated circuit design and process development. Modeling of spot defect related yield losses have been investigated in order to improve yield prediction and estimation, and various yield models have been proposed as a result. However, most of these models assume that any spot defects on the surface of an integrated circuit die causes functional failure. Such an assumption is inaccurate and is especially misleading in the case of very large scale integrated (VLSI) circuits where spot defects observed on the surface of an integrated circuit do not necessarily cause functional failures.

For example, small defects may cause deformation of the circuit connectors when such defects occur in a congested region of the integrated circuit surface. However, they do not affect the performance of the circuit when they are located in other, less dense regions of the same integrated circuit. Thus, models that do not take into account realistic relationships between defect size and defect location, with respect to the detail of the integrated circuit layout, are faulty.

The need for a better characterization of the defect size in the yield analysis exists and models dealing with the distributed nature of defect size have been constructed. The accuracy of those models depends, however, on the accuracy of the information that describes the defect size distribution and defect density. Therefore, accurate identification of the defect size distribution and density are necessary factors for the accuracy of yield analyses that use such models.

SUMMARY OF THE INVENTION

It is therefore an object of the present invention to provide a method and apparatus for detecting defects in integrated circuits.

It is another object of the present invention to provide a method and apparatus for determining the size distribution and density of defects in integrated circuits.

It is a further object of the present invention to provide a method and apparatus for determining the type of spot defects, that is whether causing opens or shorts, in a metal layer of an integrated circuit.

It is still another object of the present invention to provide a method and apparatus for determining the size and type of spot defects in metal layers of a semiconductor integrated circuit with a single electrical measurement.

These and other objects which will become apparent and are achieved in accordance with the present invention are accomplished by providing an apparatus comprising a meander formed in a high resistivity material on a substrate. The meander includes a predetermined number of intermediate segments, the ends of which are interconnected by folded segments such that an electrical circuit having an electrical resistance R, is formed between the ends of the meander. A strip of high electrical conductivity material is formed in substantial alignment with and electrically insulated from a corresponding one of each of the intermediate segments of the meander. Contact means provide electrical contact between each end of the strip of high conductivity material and a corresponding end of the corresponding intermediate segment of the meander. A first terminal is electrically connected to one end of the meander. A second terminal is electrically connected to the other end of the meander. At least one additional terminal is electrically connected to one of the contact means such that the portion of the meander between the contact means and the end of the meander includes two intermediate segments and the folded segment which is connected therebetween.

Utilizing the apparatus of the present invention, defects are identified by measuring the resistance between the first and second terminals of the test structure. This measured value is then compared to the calculated value of the resistance of the structure between the end terminals to determine whether the structure is defective. If the value of the measured resistance is substantially smaller than the calculated value, a flow due to a spot defect, which is a spot of additional high conductivity material shorting two or more strips of high conductivity material together, is considered to be present. If the measured resistance is substantially greater than the calculated resistance, a flaw due to a spot of missing high conductivity material or break, is determined to exist. The size of the defects, either spot or missing material, can be determined by additionally measuring the resistance between the third terminal and either the first or second terminal and then calculating the defect size using predetermined formulae.

DETAILED DESCRIPTION OF THE DRAWING

FIGS. 3A, 3B and 3C depict three schematic representations of equivalent circuits of the structure depicted in FIG. 1.

FIGS. 11A, 11B, 11C, and 11D depict histograms relating to resolution and defect size distribution which are obtainable from the test structure in accordance with the present invention.

Figure 12:
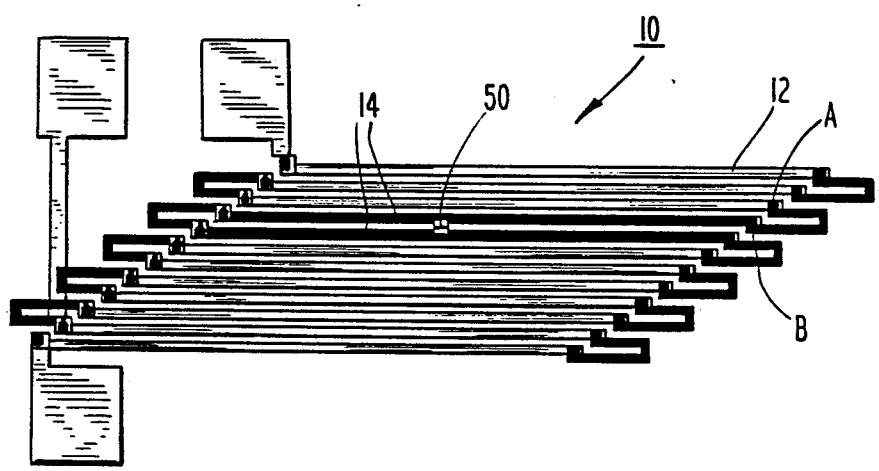

FIG. 12 is a schematic representation of the top view of a test structure in accordance with the present invention depicting a defect caused by extra material bridging high resistivity material lines in the test structure.

Figure 13:
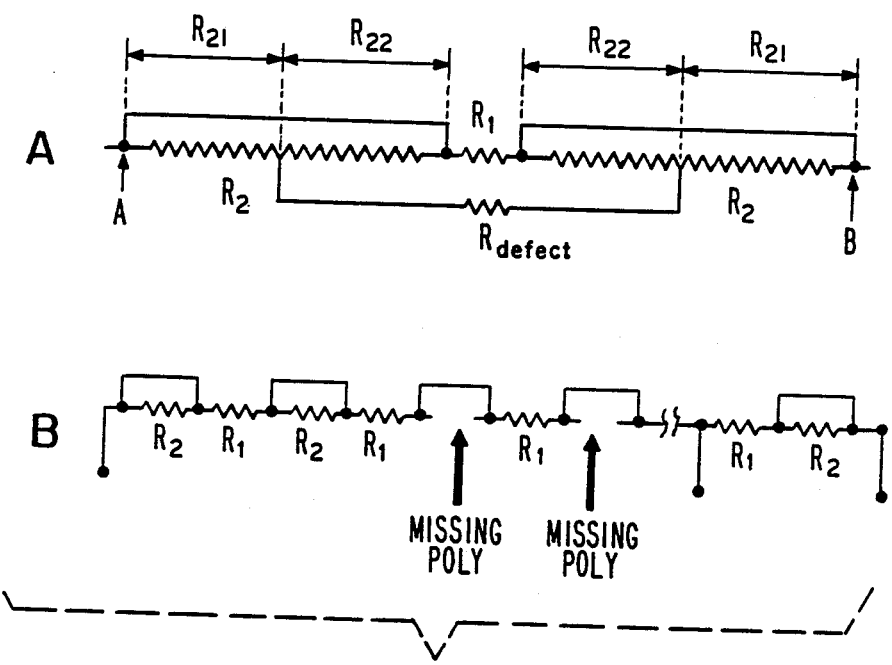

FIGS. 13A and 13B depict schematics of equivalent circuits for shorts and opens caused by extra and missing regions respectively in the high resistivity material layer.

Figure 14:
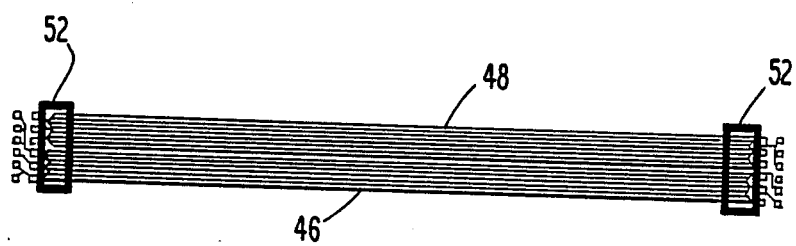

FIG. 14 depicts areas of the test structure in accordance with the present invention which are prone to spot defects in the high resistivity material layer.

DETAILED DESCRIPTION OF THE PREFERRED EMBODIMENT

Figure 1:
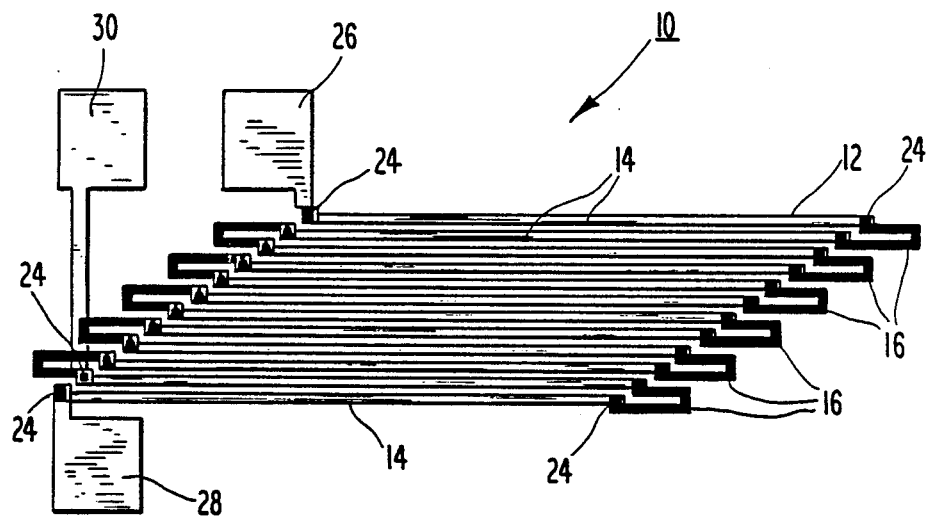
FIG. 1 is a schematic representation of a top view of a test structure in accordance with the present invention.
Figure 2:
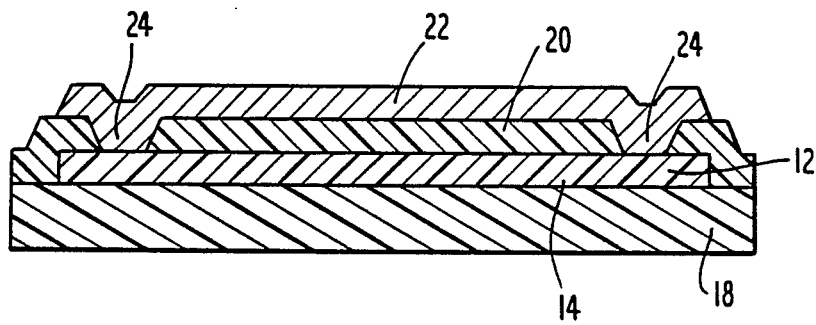
FIG. 2 is a diagramatic cross-sectional representation of a portion of the structure depicted in FIG. 1.

Referring to FIG. 1, there is shown a schematic representation of a top view of a preferred embodiment of a test structure, generally designated 10, in accordance with the present invention. Test structure 10 comprises a meander 12 comprising a high electrical resistivity (low electrical conductivity) material, such as polysilicon, which includes a plurality of intermediate segments 14, the ends of which are interconnected by folded segments 16. The intermediate segments 14 are preferably in the form of substantially straight lines; however, other patterns such as sawtooth or sinusoidal forms are useable and are considered to be within the scope of the present invention. As shown in FIG. 2, the meander 12 is preferably formed on a silicon substrate with a grown insulating thermal oxide designated as layer 18. A layer 20 of insulating material, such as silicon dioxide, is formed over and around the meander 12.

A plurality of strips 22 of high electrical conductivity material, comprising for example a metal such as aluminum, is formed over the insulating layer 20 with each metal strip 22 being substantially aligned with a corresponding intermediate segment 14 of the meander 12. High electrical resistivity (low electrical conductivity) and high electrical conductivity are terms which, in the description of the present invention, are related to each other such that the conductivity of the high electrical conductivity material is at least ten times the conductivity of the low electrical conductivity (high electrical resistivity) material. In the preferred embodiment, the conductivity of the high electrical conductivity material is approximately five thousand times the conductivity of the low electrical conductivity (high electrical resistivity) material. In the preferred embodiment, each strip 22 has a width and a length which is substantially equal to the width and length respectively of the underlying intermediate segment 14 and is positioned in substantially coincident overlying spaced relationship with respect to a corresponding underlying intermediate segment 14 of the meander 12.

The ends of each strip 22 are electrically connected to the corresponding underlying intermediate segment 14 of the meander 12 by means of contacts 24 which are formed through the insulating layer 20. First, second and third electrical contact terminals, 26, 28 and 30 respectively, are formed on the layer 18. The first terminal 26 is electrically connected to a contact 24 at one end of the meander 12. The second terminal 28 is electrically connected to a contact 24 at the other end of the meander 12. The third terminal 30 is electrically connected to a contact 24 at one end of an intermediate segment 14 of the meander 12 such that the path between the second terminal 28 and the third terminal 30 comprises an intermediate segment 14, a folded segment 16 and a second intermediate segment 14, as shown in FIG. 1.

As can be seen in FIGS. 1 and 2, the intermediate segments 14 of the polysilicon meander are shorted between the contacts 24 by the strips 22. Consequently, the equivalent circuit of the device created in this manner can be represented by a chain of resistors as shown in FIG. 3A. Resistors, labeled $R_1$ and $R_2$, represent folded segment 16 and intermediate segment 14 of the meander 12, respectively. Resistors $R_3$ represent the metal strips 22.

The resistance that is measured between the first terminal 26 (designated $T_1$ in FIG. 3) and the second terminal 28 (designated $T_2$) is substantially equal to the sum of the series connected resistances of the folded segments 16 of the meander 12 because the resistance of the high conductivity metal strips 22 is substantially smaller compared to the resistance of the unshorted portion of the high resistivity polysilicon path. The intermediate segments 14 of the meander 12 do not contribute to the resistance between $T_1$ and $T_2$ since they are shorted by the strips 22. This is shown in the schematics of the equivalent circuits depicted in FIGS. 3B and 3C. Consequently, the resistance $R_{12}$ between the first terminal $T_1$ and the second terminal $T_2$ is equal to the sum of the series resistances $R_1$.

The resistance between the second terminal $T_2$ and the third terminal 30 (designated $T_3$ in FIG. 3) is equal to the resistance of one folded segment 16 of the meander 12 since the two intermediate segments 14 have been shorted out by the metal strips 22. Therefore, as shown schematically in FIG. 3C, the resistance $R_{23}$ between the second terminal $T_2$ and the third terminal $T_3$ is equal to $R_1$, the resistance of one folded segment 16. Consequently, by measuring the resistances $R_{12}$ and $R_{23}$, and computing their ratio, an integer equal to the number of strips 22 in the structure, minus 1, is obtained.

Figure 4:
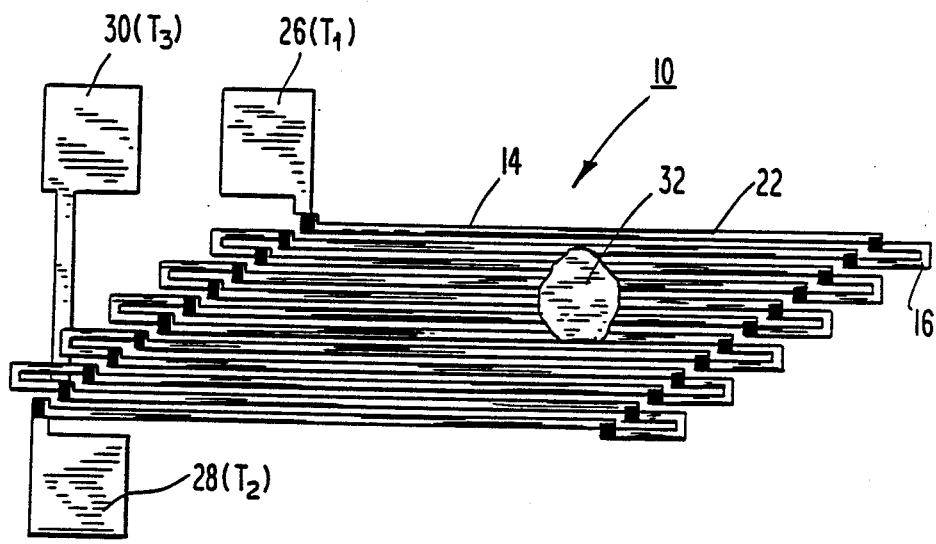
FIG. 4 is a schematic representation of the top view of a structure in accordance with the present invention, showing a flaw in the form of a spot defect.
Figure 5A:
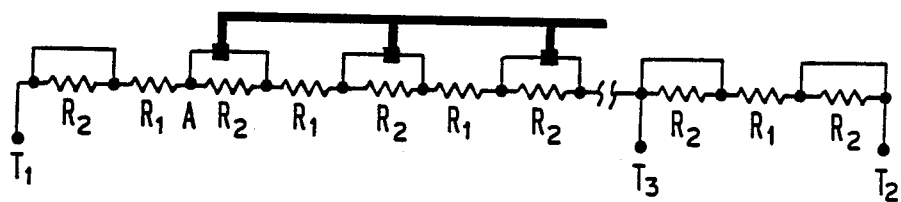
FIGS. 5A and 5B depict two schematic representations of equivalent circuit of the structure with a spot defect.
Figure 5B:

The test structure 10 of the present invention is utilized as follows. Referring now to FIG. 4, there is shown a test structure 10 having an additional spot of metal 32 formed on the surface of the metal layer due to a disturbance of the manufacturing process. The metal spot 32 causes an electrical short between some of the metal strips 22 thereby shorting out the folded segments 16 connected between these shorted out metal strips 22. This is shown in the schematic equivalent circuits depicted in FIGS. 5A and 5B. Since the resistance $R_1$ of some of the folded segments 16 have been shorted out by the excess metal defect 32, the resistance $R_{12}$, measured between the first terminal $T_1$ and the second terminal $T_2$, is smaller than the calculated value of the resistance of the test structure without an excess metal spot defect. Hence, a measured value of the resistance $R_{12}$ which is smaller than that of the calculated value of resistance $R_{12}$ indicative of the presence of an excess metal spot defect. Since, in accordance with the present invention, a short between strips is indicative of the presence of an excess metal spot defect, the structure 10 must have at least two strips 22.

The diameter of the excess metal spot 32 can be evaluated by measuring the resistance $R_{12}$ between the first terminal $T_1$ and the second terminal $T_2$; measuring the resistance $R_{23}$ between the second terminal $T_2$ and the third terminal $T_3$; then computing the ratio of $R_{12}/R_{23}$. The difference between the value obtained as a result of computing this ratio, and the number of metal strips 22 in the test structure 10, is indicative of the number of parallel metal strips 22 that are shorted by the metal spot 32. Since the pitch of the metal strip pattern is known, the approximate diameter of the defect can be determined.

Figure 6:
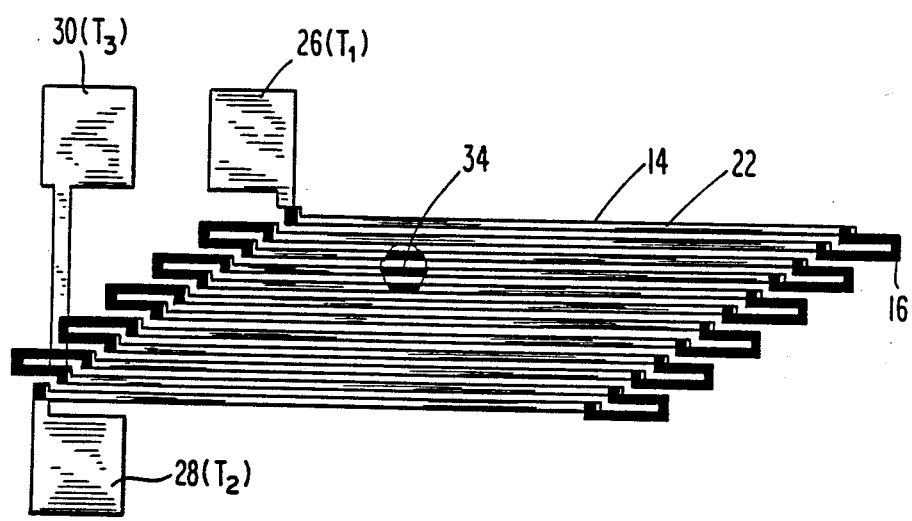
FIG. 6 is a schematic representation of the top view of a structure in accordance with the present invention having a defect consisting of missing high conductivity material.
Figure 7:
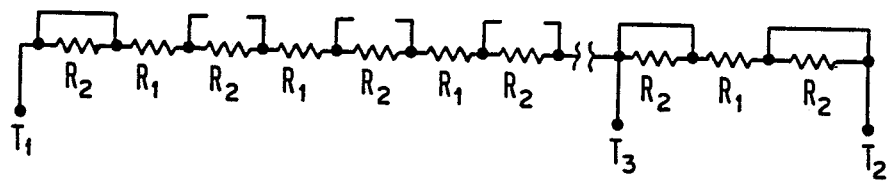
FIG. 7 is a schematic representation of the equivalent circuit of the structure of the present invention with a defect consisting of missing high conductivity material depicted in FIG. 6.

The test structure 10 of the present invention can also be used to detect a region with missing metal and to measure the size of that region. Referring now to FIG. 6, there is shown the test structure 10 having a region of missing metal 34 on the metal layer due to a disturbance in the manufacturing process. As shown in FIG. 6, some of the intermediate segments 14 of the meander 12 are no longer shorted due to the region of missing metal 34. This is represented schematically in FIG. 7 where the breaks shown in the parallel short circuit paths of the resistances $R_2$ are caused by the region of missing metal 34. Since some of the short circuit paths are now open, the resistance $R_{12}$ measured between the first terminal $T_1$ and the second terminal $T_2$ is greater than the calculated value of the resistance $R_{12}$ of the test structure without defects. Therefore a measured value of the resistance $R_{12}$ which is greater than the calculated value is indicative of the presence of a defect due to a region of missing metal.

The size of the region of missing metal 34 can be calculated as follows: The total resistance $R_{12}$ between the first terminal $T_1$ and the second terminal $T_2$ is equal to the resistance $R_{12}$ measured on the test structure without a spot defect plus $n_m \times R_2$ where $n_m$ is an integral number of broken metal connections in the structure and $R_2$ is the resistance of an intermediate segment 14 of the polysilicon meander 12. Since the pitch of the metal strip pattern is known, the diameter of the missing metal region can be determined.

The preferred embodiment of test die 40 is used to classify sizes of defects with extra or missing metal as follows. In setting forth the description of the method of classification, the following definitions apply:

(1) $R_{14}$ represents the value of the resistance measured between the end terminals, for example terminals $T_1$ and $T_4$ (see FIG. 8), of a single test structure 10.

Figure 8:
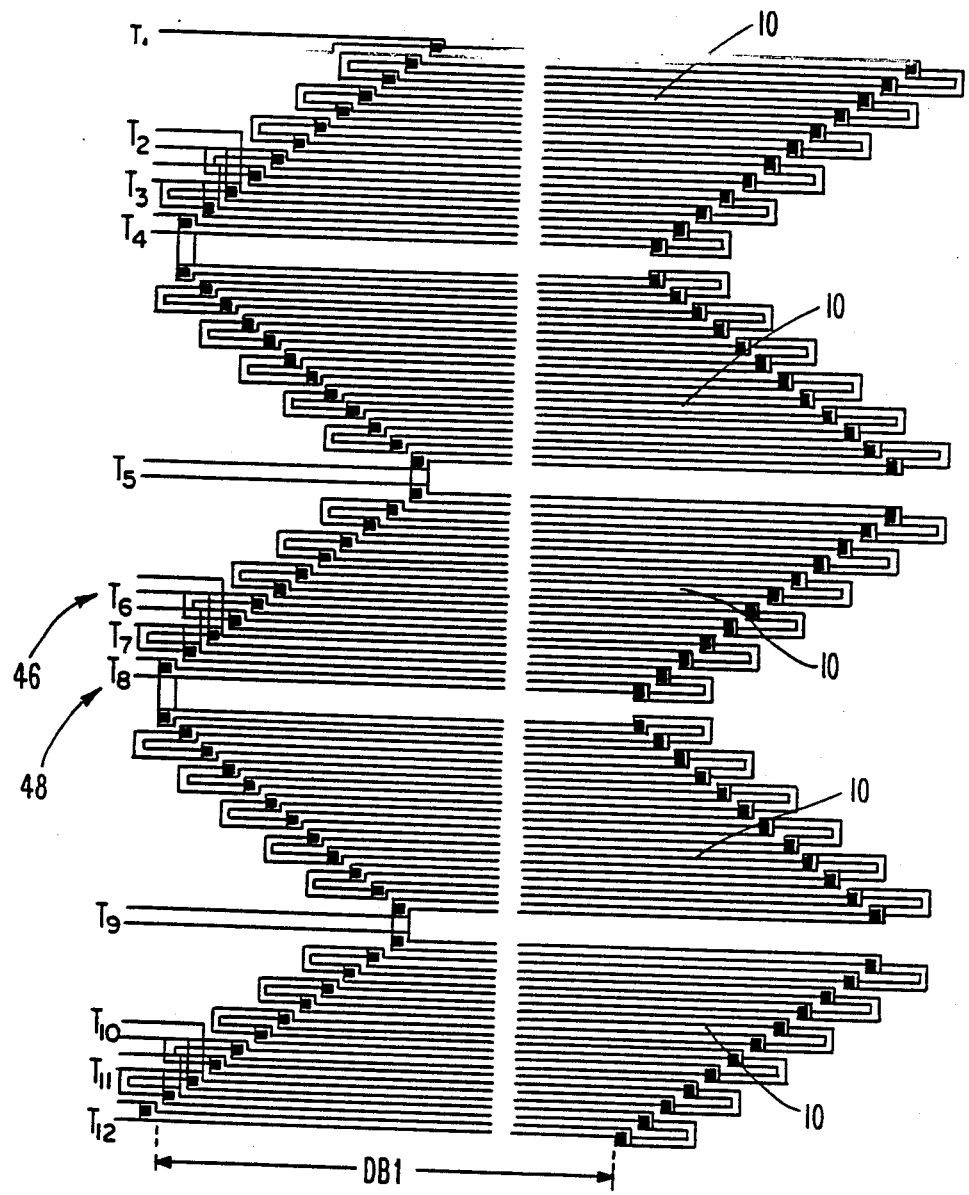
FIG. 8 is a top view of a preferred embodiment of a test structure in accordance with the present invention.

(2) $R_{34}$ represents the value of the resistance of one folded element of the polysilicon path; for example, the resistance between terminals $T_3$ and $T_4$ (see FIG. 8). $R_{23}$ can also be used to evaluate the resistance of a single folded element; for example, the resistance between terminals $T_2$ and $T_3$.

(3) DB2 is the width of the metal strips 22 and the intermediate segments 14 of the polysilicon meander (See FIG.

Figure 9:
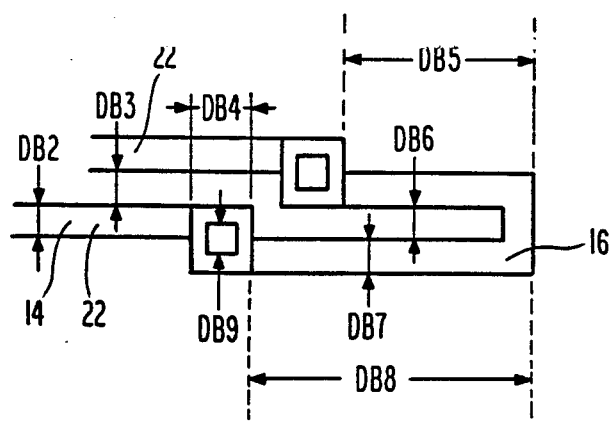
FIG. 9 is a diagramatic representation of one folded segment of a portion of a test structure in accordance with the present invention.

(4) DB3 is the space between the metal strips 22 (See FIG. 9).

(5) SQM is the number of squares in the metal strips 22 and the intermediate segments 14 of the polysilicon meander.

(6) SQP is the number of squares in the folded segment 16 of the polysilicon meander.

(7) n is the number of metal strips 22 of any device; therefore, n−1 is the number of folded segments 16 in the structure.

Utilizing the above definitions, the defect size measurement and classification procedure is performed as follows: First, electrical resistance measurement equipment is electrically connected to terminals $T_1$, $T_3$ and $T_4$ of the test structure 10 (see FIG. 8). The values of $R_{14}$ and $R_{34}$ are then measured. Next the value of $n_r = R_{14}/R_{34}$ is computed. The computed value of $n_r$ is compared with the quantity n−1. If $n_r$ is equal to n−1, no defect exists; therefore the location of the next test structure is found and the above-stated procedure is repeated. If $n_r$ is not equal to n−1, a determination is made whether $n_r$ is greater than n−1. If so, a defect comprising missing metal has been determined. The diameter $d_m$ of this missing metal defect is in the range defined by the formula:

$$DB2+(n_m-1)(DB2+DB3) < d_m < DB3+(n_m+1)(DB2+DB3),$$

where $n_m$ is a number of broken metal strips that can be evaluated from the formula:

$$n_m = (SQP/SQM)(R_{14}/R_{34}-n+1).$$

If $n_r$ is less than n−1, then a defect which has shorted the metal segments 22 has been detected. The diameter $d_e$ of this defect, is in the range defined by the formula:

$$DB3+(n_e-1)(DB2+DB3) < d_e < DB3+(n_e+1)(DB2+DB3),$$

where $n_e$ is a number of shorts between metal strips that can be evaluated by the formula:

$$n_e = (n-1-R_{14}/R_{34}).$$

After making the determination of the type and size of defect, the next test structure is located and the procedure is repeated.

Figure 10:
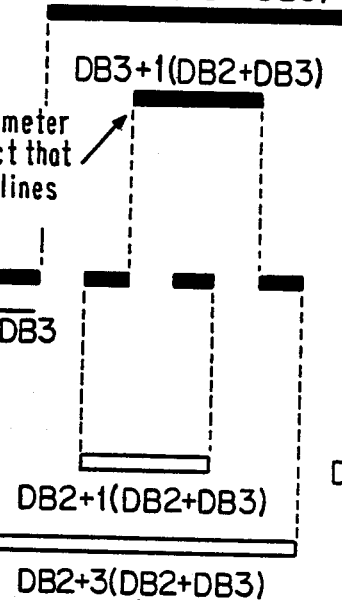
FIG. 10 is a chart showing the relationships between defect size and number of shorted or broken lines on the test structure in accordance with the present invention.

The relation between the number of shorted or broken lines and the size of the defect is diagramatically depicted in FIG. 10. It can be seen from this figure that the diameter of a spot defect can be determined in terms of a range whose size is equal to the pitch of the test structure that is, DB2+DB3 (see FIG. 9). Thus, a limitation in the resolution of the test structure 10 is determined by the limits in the resolution with which the test structure 10 can be fabricated. Consequently, the smallest possible pitch should be used in the design of the test structure 10. It should be noted that measurements taken from terminals $T_4$ through $T_{12}$ can also be used in the performance of the defect size measurement and classification procedure described above.

Another limitation in the resolution of the test structure 10 is illustrated by the histograms depicted in FIGS. 11A, 11B and 11C. As previously stated, $n_e$ and $n_m$ should be integers. However, the actual values of $n_e$ and $n_m$ are computed using values of the ratio $R_{14}/R_{34}$ which are in general non-integers. This situation occurs because the sheet resistance, as well as the width of the polysilicon meander paths, are non-uniform. In addition, these non-uniformities have a random nature. Consequently, the values of $n_e$ and $n_m$ will be random variables which must be rounded to the closest integer. This is illustrated in the histograms depicted FIG. 11A through 11C. FIG. 11A is a histogram of the ideal number of shorted metal strips 22 caused by an excess metal defect. FIG. 11B is a histogram of the actual number of shorted metal strips 22 which are shorted by an excess metal defect in the test structure 10. The test structure resolution is determined in terms of the number of samples that can be classified as integers to the number of samples that cannot be classified as integers as shown in FIG. 13C.

Realistically, it must be assumed that some of the values computed from the above formulas and shown in FIG. 11C, cannot be classified as integers because such an approximation is justified only in the case where the rounded number has a value that is close enough to be an integer. These values will represent defects that cannot be measured with certainty using the test structure 10 of the present invention. A large number of such defects degrade the resolution of the test structure 10; however, it is estimated that the population of defects of this nature will not exceed 10% of the entire failure distribution.

Test structure resolution is optimized in accordance with the present invention by an appropriate choice of the number of metal strips 22 and underlying intermediate segments 14 in a single test structure 10. That is, the number of strips and intermediate segments are chosen so that the change of the resistance seen between the end terminals of the test structure 10 is much larger than all anticipated random changes of this resistance due to the random instability in the manufacturing process. In other words, if it is assumed that the spread in the resistance measured between the end terminals of a single test structure 10, without a spot defect, is $\Delta R_{14}$; then $R_{34}$ must be significantly larger than $\Delta R_{14}$. Assuming, for example, that $\Delta R_{14}$ is 5% of $R_{14}$, the number of strips and intermediate segments in the test structure 10 are chosen to be smaller than $R_{14}/\Delta R_{14}$; that is, less than twenty and preferably sixteen for practical applications. A choice of this kind assures that any short or break causes larger changes in the resistance $R_{14}$ than the process induced variations in resistance. Hence, the pitch of test structure 10 and the number of strips and underlying straight segments in the structure, are primary factors in determining the defect resolution obtainable with the structure.

In the above description, the role of spot defects was discussed with respect to the metal layer only. In actual manufacturing processes, spot defects can occur on all layers. Therefore, the following is a description of the test structure 10, in accordance with the present invention, for determining the presence and size of the spot defects in the high resistivity polysilicon layer. FIG. 12 depicts a spot defect 50 that shorts two intermediate segments 14 of the polysilicon meander 12 in the test structure 10. The short created by the spot defect 50 causes a change in the electrical equivalent circuit between nodes A and B as shown in FIG. 13A. As can be seen from that equivalent circuit, the resistance $R_{AB}$ between nodes A and B is:

$$R_{AB} = R_1 \| (2R_{21} \| R_{22} + R \text{ defect}).$$

The equivalent resistance $R_{AB}$ without a spot defect is equal to $R_1$. Thus, the resistance measured between the end terminals of the test structure 10 can be disturbed by a spot defect in the polysilicon layer (the layer containing the polysilicon meander) only in those cases where $R_{21}$ or $R_{22}$ (see FIG. 13A) is comparable with $R_1$. This occurs only where the spot defect is located close to the contacts. If the test structure 10 is built such that $R_2$ is much greater than $R_1$; that is, where the metal strips 22 and underlying intermediate segments 14 are much longer than the folded segments 16 of the meander 12, then $2R_{21} R_{22}$ is much greater than $R_1$ for the majority of locations of the spot defects in the polysilicon layer. This means that the majority of the polysilicon spot defects will not change the value of $R_{AB}$ in such a structure.

As seen in FIG. 13B, breaks in the path of the polysilicon meander 12 will disturb the resistance measurements only in the case where they are located in the folded segments of the structure. In all other cases their influence is small. This re-enforces the desirability to design this test structure such that the folded segments 16 are much shorter than the metal strips 22 and underlying intermediate segments 14. Therefore, as shown in FIG. 14, the area that is prone to the spot defect in the polysilicon layer can be minimized. This area, indicated by the boxes 52 in FIG. 14, is comparable to twice the area covered by the folded segment 16 of the polysilicon meander 12.

In determining the appropriate sizes of the test structures 10, consideration is directed to two area related factors. The first factor is the ratio of the area that is sensitive to spot defects in the metal layer to the total area, that is the area utilization factor. As far as this factor is concerned, it is desirable to maximize the area covered with the metal strips 22 and minimize all other areas. Since the area of the terminals and the width of a single test structure 10 is determined by the resolution requirements described above, the only other parameter that can be manipulated is the length of the structure. In view of the considerations discussed above, the test structure 10 should be as long as possible. However, the longer the structure, the larger the non-uniformity in the geometry and resistivity of the polysilicon and metal paths due to process induced variations.

In addition, an increase in the area of a single structure is equivalent to an increase in the probability that two defects may occur in a single structure. The increase in the length of the structure translates to an increase in the resistance that is measured between the end terminals of the structure for a break in the metal lines 22. Therefore, the length of a single structure 10 should be chosen such that: (1) an estimate of a probability of the occurrence of two defects in the same test device is small; (2) the random differences between resistances of folded segments 16 of the polysilicon meander at two ends o the test structure 10 are small; and (3) the largest resistance that may be seen between the end terminals of the test structure 10 (that is, resistance measured when all metal strips 22 are broken) can be measured with the measurement equipment utilized with the test structure.

As can be seen from the above detailed description of the preferred embodiment, use of the test die in accordance with the the present invention will detect spot defects in the metal layer, which defects are due to abnormalities in the manufacturing process to which the test die and integrated circuits semiconductor devices are subjected. Use of such a test die not only enables the determination and size distribution of such spot defects, it also enables the determination of the density of such defects. Such determinations can be consistently and accurately made on the test die; and, since the test die has undergone the same processing as the integrated circuit semiconductor devices, such determinations can be attributed to the integrated circuit devices even though such devices do not exhibit actual functional failures.

It will be understood that various changes in the details, materials, and arrangements of the parts which have been described and illustrated in order to explain the nature of this invention, may be made by those skilled in the art without departing from the principle and scope of the invention as expressed in the following claims.

We claim:

1. An apparatus for detecting spot defects in a metal layer of an integrated circuit, said apparatus comprising:

(a) a substrate;

(b) a meander formed on said substrate, said meander comprising a high electrical resistivity material having a predetermined number of intermediate segments, the ends of which are interconnected by folded segments such that an electrical circuit, having an electrical resistance R, is formed between the ends of the meander;

(c) a strip of high electrical conductivity material in substantial alignment with and electrically insulated from a corresponding one of each of said intermediate segments;

(d) contact means for providing electrical contact between each end of said strip and a corresponding end of said corresponding intermediate segment;

(e) a first terminal electrically connected to one end of said meander;

(f) a second terminal electrically connected to the other end of said meander;

(g) at least one additional terminal electrically connected to one of said contact means such that the portion of the meander between said one of said contact means and an end of said meander includes two intermediate segments and the folded segment connected therebetween.

2. The apparatus in accordance with claim 1 wherein said predetermined number of intermediate segments is at least two.

3. The apparatus in accordance with claim 2 wherein said predetermined number of intermediate segments is 16.

4. The apparatus in accordance with claim 1 wherein said meander is formed of polysilicon material.

5. The apparatus in accordance with claim 4 wherein said strips are formed of metal.

6. The apparatus in accordance with claim 5 wherein said metal is aluminum.

7. A method for detecting spot defects in semiconductor integrated circuit devices, said method comprising the steps of:

(a) forming a meander on a substrate, said meander comprising a high electrical resistivity material having a predetermined number of intermediate segments, the ends of which are interconnected by folded segments such that an electrical circuit, having an electrical resistance R, is formed between the ends of the meander;

(b) forming a strip of high electrical conductivity material in substantial alignment with and electrically insulated from a corresponding one of each of said intermediate segments;

(c) providing contact means for electrically connecting each end of said strip to a corresponding end of said corresponding intermediate segment;

(d) electrically connecting a first terminal to one end of said meander;

(e) electrically connecting a second terminal to the other end of said meander;

(f) electrically connecting at least one additional terminal to one of said contact means such that the portion of the meander between said one of said contact means and an end of said meander includes two intermediate segments and the folded segment connected therebetween;

(g) measuring the electrical resistance R between the first end terminal and the second end terminal;

(h) measuring the electrical resistance $R_1$ between said additional terminal and an end terminal, the path therebetween comprising that portion of the meander which includes two intermediate segments and the folded segment connected therebetween;

(i) calculating the ratio, $n_r$, of $R/R_1$; and (j) providing an indication of :

(i) no defects where $n_r$, is equal to $n-1$, the number of folded segments in the meander;

(ii) the presence of a missing metal defect where $n_r$ is greater than $n-1$; and (iii) an extra metal defect where $n_r$ is less than $n-1$.

8. The method in accordance with claim 7 additionally comprising the step of determining the diameter of a spot defect.

9. The method in accordance with claim 8 in which (a) determining the lower limit of a missing metal spot defect diameter a being substantially equal to the width of a strip plus the number of broken strips minus one multiplied by the sum of the width of a strip plus the width of the space between adjacent strips; and (b) determining the upper limit of the missing metal spot defect diameter as being substantially equal to the width of the space between adjacent strips plus the number of broken strips plus one multiplied by the sum of the width of a strip plus the width of the space between adjacent strips.

10. The method in accordance with claim 9 additionally comprising the step of determining the number of broken strips as being equal to the ratio of the number of squares in the strips and corresponding intermediate segments of the meander to the number of squares in the folded segments of the meander multiplied by the ratio of R to $R_1$ minus the number of strips plus one.

11. The method in accordance with claim 7 in which said additional step comprises:

(a) determining the lower limit of an excess metal spot defect diameter as being substantially equal to the width of the space between adjacent strips plus the number of shorts between strips minus one multiplied by the sum of the width of a strip plus the width of the space between adjacent strips;

(b) determining the upper limit of the excess metal spot defect diameter to be substantially equal to the width of the space between strips plus the sum of the number of shorts between strips plus one multiplied by the sum of the width of a strip plus the width of the space between adjacent strips.

12. The method in accordance with claim 11 additionally comprised in the step of determining the number of shorts between strips as being equal to the number of strips in the structure minus one, minus the ratio of R to $R_1$.

* * * * *